United States Patent
Chou et al.

(10) Patent No.: US 10,103,128 B2
(45) Date of Patent: Oct. 16, 2018

(54) SEMICONDUCTOR PACKAGE INCORPORATING REDISTRIBUTION LAYER INTERPOSER

(71) Applicant: MEDIATEK INC., Hsin-Chu (TW)

(72) Inventors: Che-Ya Chou, Kaohsiung (TW);
Kun-Ting Hung, Hsinchu (TW);
Chia-Hao Yang, Hsinchu (TW);
Nan-Cheng Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/588,690

(22) Filed: May 7, 2017

(65) Prior Publication Data

US 2017/0243858 A1    Aug. 24, 2017

Related U.S. Application Data

(63) Continuation-in-part of application No. 15/182,613, filed on Jun. 15, 2016, and a continuation-in-part of
(Continued)

(51) Int. Cl.
*H01L 23/495*     (2006.01)
*H01L 25/065*     (2006.01)
(Continued)

(52) U.S. Cl.
CPC ...... *H01L 25/0657* (2013.01); *H01L 23/3135* (2013.01); *H01L 23/49811* (2013.01); *H01L 23/49816* (2013.01); *H01L 23/49827* (2013.01); *H01L 23/49833* (2013.01); *H01L 24/19* (2013.01); *H01L 24/20* (2013.01); *H01L 24/96* (2013.01); *H01L 24/97* (2013.01); *H01L 25/03* (2013.01); *H01L 25/0652* (2013.01); *H01L 25/16* (2013.01); *H01L 25/18* (2013.01); *H01L 25/50* (2013.01); *H01L 21/561* (2013.01); *H01L 21/568* (2013.01); *H01L 23/49822* (2013.01); *H01L 25/0655* (2013.01); *H01L 2223/6677* (2013.01); *H01L 2224/04042* (2013.01);
(Continued)

(58) Field of Classification Search
CPC ............ C09K 11/06; C09K 2211/1007; H01L 51/5016; H01L 51/56; H01L 24/16
USPC ........................................................ 257/668
See application file for complete search history.

(56) References Cited

U.S. PATENT DOCUMENTS 6,759,753 B2    7/2004   Chao
8,084,853 B2   12/2011   Hsieh
(Continued)

FOREIGN PATENT DOCUMENTS

CN     101814474 A    8/2010
CN     102034777 A    4/2011
(Continued)

*Primary Examiner* — Andy Huynh
(74) *Attorney, Agent, or Firm* — Winston Hsu

(57) ABSTRACT

A semiconductor package is provided. The semiconductor package includes a carrier substrate having opposite first surface and second surface, and a chip stack disposed on the first surface of the carrier substrate. The chip stack includes a first semiconductor die, a second semiconductor die, and an interposer between the first semiconductor die and the second semiconductor die. The interposer transmits signals between the first semiconductor die and the second semiconductor die.

19 Claims, 11 Drawing Sheets

Related U.S. Application Data application No. 14/850,962, filed on Sep. 11, 2015, now abandoned, which is a continuation of application No. 14/045,803, filed on Oct. 4, 2013, now Pat. No. 9,165,877.

(60) Provisional application No. 62/357,401, filed on Jul. 1, 2016, provisional application No. 62/409,391, filed on Oct. 18, 2016, provisional application No. 62/241,248, filed on Oct. 14, 2015.

(51) Int. Cl.
| | | |
|---|---|---|
| *H01L 23/31* | (2006.01) | |
| *H01L 23/498* | (2006.01) | |
| *H01L 23/00* | (2006.01) | |
| *H01L 25/03* | (2006.01) | |
| *H01L 25/16* | (2006.01) | |
| *H01L 25/18* | (2006.01) | |
| *H01L 25/00* | (2006.01) | |
| *H01L 21/56* | (2006.01) | |

(52) U.S. Cl.
CPC ............ *H01L 2224/04105* (2013.01); *H01L 2224/12105* (2013.01); *H01L 2224/16227* (2013.01); *H01L 2224/19* (2013.01); *H01L 2224/32145* (2013.01); *H01L 2224/32225* (2013.01); *H01L 2224/48137* (2013.01); *H01L 2224/48227* (2013.01); *H01L 2224/73204* (2013.01); *H01L 2224/73265* (2013.01); *H01L 2224/73267* (2013.01); *H01L 2224/85005* (2013.01); *H01L 2224/92244* (2013.01); *H01L 2224/92247* (2013.01); *H01L 2224/97* (2013.01); *H01L 2225/0651* (2013.01); *H01L 2225/06537* (2013.01); *H01L 2225/06568* (2013.01); *H01L 2225/06572* (2013.01); *H01L 2924/00014* (2013.01); *H01L 2924/01322* (2013.01); *H01L 2924/12042* (2013.01); *H01L 2924/141* (2013.01); *H01L 2924/142* (2013.01); *H01L 2924/1421* (2013.01); *H01L 2924/15192* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01); *H01L 2924/3025* (2013.01)

(56) References Cited

U.S. PATENT DOCUMENTS

| | | |
|---|---|---|
| 8,310,051 B2 | 11/2012 | Chen |
| 8,900,931 B2 | 12/2014 | Liang |
| 2002/0027295 A1 | 3/2002 | Kikuma |
| 2003/0111716 A1 | 6/2003 | Ano |
| 2004/0184250 A1 | 9/2004 | Wang |
| 2004/0195591 A1* | 10/2004 | Gehman ............ H01L 23/552 257/202 |
| 2005/0194674 A1 | 9/2005 | Thomas |
| 2005/0212114 A1 | 9/2005 | Kawano |
| 2008/0261039 A1 | 10/2008 | Tanaka |
| 2008/0296050 A1 | 12/2008 | Uda |
| 2010/0072602 A1 | 3/2010 | Sutardja |
| 2010/0213588 A1 | 8/2010 | Hsieh |
| 2010/0213589 A1 | 8/2010 | Hsieh |
| 2011/0006417 A1 | 1/2011 | Sugihara |
| 2011/0074008 A1 | 3/2011 | Hsieh |
| 2012/0032314 A1 | 2/2012 | Chen |
| 2012/0032322 A1 | 2/2012 | Lin |
| 2014/0054760 A1 | 2/2014 | Yu |
| 2015/0140736 A1 | 5/2015 | Pendse |

FOREIGN PATENT DOCUMENTS

| | | |
|---|---|---|
| CN | 103199075 | 7/2013 |
| JP | 201073893 A | 4/2010 |
| TW | 201327769 A1 | 7/2013 |
| TW | 201342569 A | 10/2013 |

\* cited by examiner

SEMICONDUCTOR PACKAGE INCORPORATING REDISTRIBUTION LAYER INTERPOSER

CROSS REFERENCE TO RELATED APPLICATION

This application is a continuation-in-part of U.S. application Ser. No. 15/182,613 filed Jun. 15, 2016, which itself is a continuation-in-part of U.S. application Ser. No. 14/850,962 filed Sep. 11, 2015. U.S. application Ser. No. 14/850,962 is a continuation application of U.S. patent application Ser. No. 14/045,803 filed Oct. 4, 2013, now U.S. Pat. No. 9,165,877B2. U.S. application Ser. No. 15/182,613 claims priorities from U.S. provisional application No. 62/241,248 filed Oct. 14, 2015. This application also claims priorities from U.S. provisional application No. 62/357,401 filed Jul. 1, 2016, and U.S. provisional application No. 62/409,391 filed Oct. 18, 2016. All of the above-mentioned applications are included herein in their entirety by reference.

BACKGROUND

The present invention relates generally to semiconductor packaging and, more particularly, to a multi-chip (or multi-die) package incorporating a redistribution layer (RDL) interposer.

As known in the art, there are a variety of chip package techniques such as ball grid array (BGA), wire bonding, flip-chip, etc. for mounting a die on a substrate via the bonding points on both the die and the substrate. To ensure miniaturization and multi-functionality of electronic products or communication devices, semiconductor packages are required to be of small in size, multi-pin connection, high speed, and high functionality.

Wire-bonding System-in-Package (WBSiP) technology is widely used because it can increase the capacity of the semiconductor package. WBSiP includes a plurality of chips, which are stacked and may be connected to each other by way of wire bonding. However, the conventional WBSiP encounters several problems, for example, the thickness of the package, ability to support fine pitch pad, and low-resistance/inductance IP.

Increased input-output (I/O) pin count combined with increased demands for high performance ICs has led to the development of flip-chip packages. Flip-chip technique uses bumps on bonding pads on chip to interconnect directly to the package medium. The chip is bonded face down to the package medium through the shortest path. The technique can be applied not only to single-chip packaging, but also to higher or integrated levels of packaging in which the packages are larger and to more sophisticated substrates that accommodate several chips to form larger functional units. The flip-chip technique, using an area array, has the advantage of achieving the highest density of interconnection to the device and a very low inductance interconnection to the package.

However, the conventional flip-chip technique is facing the challenge of bump pitch limitation on the substrate. Besides, a high-performance FCBGA package is costly due to the expensive chip carrier substrate that typically comprises 1+2+1 or more-layer build up. The bottleneck of the flip-chip roadmap is the bump pitch of the substrate since the development and shrinkage of the bump pitch is much slower than the die shrinking and the increase of the pin count. Even the die shrinking will exceed the shrinkage of bump pitch resolution on substrate carrier in the future.

To conquer the issue of such technology gap, silicon interposer and TSV (Through Silicon Via) technology, and fine pitch bump technology are preferred solutions. However, the above-mentioned TSV-based technologies are expensive and involve complex fabrication processes.

SUMMARY

It is one object of the present invention to provide an improved semiconductor package incorporating a redistribution layer (RDL) interposer.

It is another object of the present invention to provide a non-TSV based, three-dimensional (3D) wire-bonding SiP package that provides advantages over the prior art wire-bonding SiP.

The present invention has been made to solve the problems occurring in the prior art and provide additional advantages, by providing a SiP with reduced wire length and RF shielding between SoC and DRAM die.

According to one aspect of the disclosure, a semiconductor package is provided. The semiconductor package includes a carrier substrate having opposite first surface and second surface, and a chip stack disposed on the first surface of the carrier substrate. The chip stack includes a first semiconductor die, a second semiconductor die, and an interposer between the first semiconductor die and the second semiconductor die. The interposer transmits signals between the first semiconductor die and the second semiconductor die.

According to one embodiment, the first semiconductor die and the second semiconductor die are both wire-bonded chips. The first semiconductor die comprises a DRAM known-good-die or an application-specific integrated circuit. The second semiconductor die comprises a system on chip or an application-specific integrated circuit.

According to one embodiment, the carrier substrate comprises an organic package substrate having metal traces and resins. According to one embodiment, the interposer comprises a silicon interposer or a resin substrate interposer.

According to one embodiment, the interposer comprises a command/address (CA) bonding pad, a rearranged bonding pad, a data (DQ) bonding pad, and an internal trace electrically coupling the bonding pad to the rearranged bonding pad.

According to one embodiment, the first semiconductor die comprises at least a command/address (CA) signal pad disposed on a first edge of the first semiconductor die, and at least a data (DQ) signal pad disposed on a second edge opposite to the first edge of the first semiconductor die, and wherein the CA bonding pad is in proximity to the CA signal pad and the first edge, and wherein the rearranged bonding pad and the DQ bonding pad are in proximity to the DQ signal pad and the second edge.

According to one embodiment, the CA signal pad is electrically coupled to the CA bonding pad of the interposer through a first bonding wire.

According to one embodiment, the DQ signal pad is electrically coupled to the DQ bonding pad of the interposer through a second bonding wire.

According to one embodiment, the DQ signal pad and the rearranged bonding pad are electrically coupled to the carrier substrate.

According to one embodiment, the second semiconductor die comprises an input/output (I/O) pad for transmitting CA signal and an I/O pad for transmitting DQ signal on the active surface of the second semiconductor die.

According to one embodiment, the I/O pads for transmitting DQ and CA signals are electrically coupled to the CA bonding pad and the DQ bonding pad through a third bonding wire and a fourth bonding wire, respectively.

According to one embodiment, the I/O pads for transmitting DQ and CA signals are electrically coupled to the carrier substrate.

According to one embodiment, the interposer further comprises a ground plane shielding the second semiconductor die from the first semiconductor die.

According to another aspect of the invention, a semiconductor package includes a carrier substrate having opposite first surface and second surface, and a chip stack disposed on the first surface of the carrier substrate. The chip stack comprises a first semiconductor die, a second semiconductor die, and an interposer between the first semiconductor die and the second semiconductor die. One of the first semiconductor die and the second semiconductor die is a flip chip. The interposer transmits signals between the first semiconductor die and the second semiconductor die.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
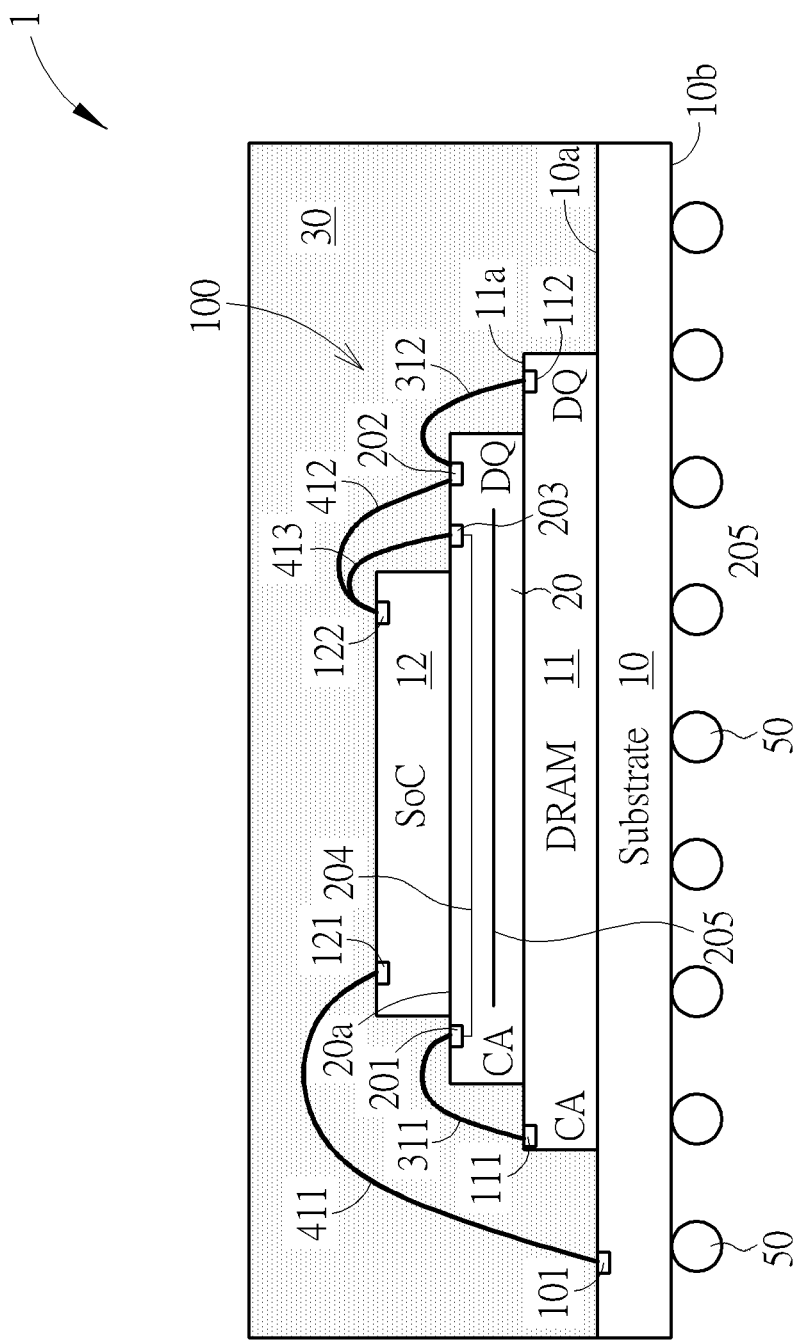
FIG. 1 is a schematic, cross-sectional diagram showing a semiconductor package in accordance with one embodiment of the invention, wherein the exemplary chip stack comprises an interposer between the SoC and the DRAM KGD.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The term "horizontal" as used herein is defined as a plane parallel to a major plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "system in package" or "SiP" means that multiple integrated circuit (IC) chips or dies having various functions are enclosed in a single module (package). A system on a chip or system on chip (SoC) is referred to as an integrated circuit that integrates various components of a computer or other electronic system into a single chip.

One embodiment of the present invention pertains to a non-TSV based, three-dimensional (3D) wire-bonding SiP incorporating a redistribution layer (RDL) interposer. The semiconductor dies such as SoC and DRAM known-good-die (KGD) are stacked vertically. The SoC and the DRAM KGD may be interconnected to each other by wire-bonding through the RDL interposer and/or a packaging substrate. The present invention may be suited for various applications such as mobile phones or Internet of Things (IoT).

Please refer to FIG. 1. FIG. 1 is a schematic, cross-sectional diagram showing a semiconductor package in accordance with one embodiment of the invention.

As shown in FIG. 1, the semiconductor package 1 comprises a carrier substrate 10 having opposite first surface 10a and second surface 10b. A chip stack 100 is disposed on the first surface 10a of the carrier substrate 10. A plurality of solder balls 50 such as BGA balls may be disposed on the second surface 10b of the carrier substrate 10. The solder balls 50 may be reflowed to attach the semiconductor package 1 to a printed circuit board (PCB) or a mother board (not shown).

For example, the carrier substrate 10 may be an organic package substrate comprising metal traces and resins such as bismaleimide triazene (BT) epoxy resin or the like. It is understood that other materials may be used to form the carrier substrate 10, for example, ceramic or plastic. For the sake of simplicity, the internal routing of the carrier substrate 10, which electrically couples the semiconductor die signals to the solder balls on the second surface 10b, is not shown.

The chip stack 100 comprises a semiconductor die 11 that is directly mounted on the first surface 10a of the carrier substrate 10. The semiconductor die 11 may be mounted on the first surface 10a by using an adhesive, but is not limited thereto. For example, according to the embodiment, the semiconductor die 11 may be a DRAM known-good-die (hereinafter referred to as DRAM KGD) such as LPDDR3 or LPDDR4, but is not limited thereto. In some embodiments, the semiconductor die 11 may be an application-specific integrated circuit (ASIC).

According to the embodiment, the chip stack 100 further comprises an interposer 20 such as a redistribution layer (RDL) interposer. The interposer 20 may be directly mounted on a top surface 11a of the semiconductor die 11. The interposer 20 partially overlaps with the top surface 11a of the semiconductor die 11. For example, the interposer 20 may be disposed on a central area of the top surface 11a of the semiconductor die 11 such that the peripheral wire-bonding pad area of the semiconductor die 11 may be exposed.

The interposer 20 may be mounted on the top surface 11a by using an adhesive, but is not limited thereto. For example, the interposer 20 may comprise a silicon interposer or a resin substrate interposer. According to the embodiment, the interposer 20 does not comprise any through silicon via or through substrate via (TSV).

According to the embodiment, the chip stack 100 further comprises a semiconductor die 12. For example, the semiconductor die 12 may comprise a system on chip (SoC) or an ASIC, but is not limited thereto. According to one embodiment, the semiconductor die 12 is a SoC and the semiconductor die 11 is a DRAM KGD. According to the embodiment, the semiconductor die 12 and semiconductor die 11 are both wire-bonded chips. Furthermore, according to other embodiments, the semiconductor die 12 could be a flip-chip semiconductor die that is mounted on the interposer 20.

The semiconductor die 12 may be directly mounted on a top surface 20a of the interposer 20. The semiconductor die 12 partially overlaps with the top surface 20a of the interposer 20. For example, the semiconductor die 12 may be disposed on a central area of the top surface 20a of the interposer 20 such that the peripheral wire-bonding pad area of the interposer 20 may be exposed.

The inactive bottom surface of the semiconductor die 12 may be adhered to the top surface 20a of the interposer 20 by using an adhesive, but is not limited thereto. The active surface of the semiconductor die 12 faces upwardly. On the active surface of the semiconductor die 12, a plurality of input/output (I/O) pads 121 and 122 are arranged.

According to the embodiment, the I/O pads 121 are disposed along a first edge of the semiconductor die 12, and the I/O pads 122 are disposed along a second edge opposite to the first edge of the semiconductor die 12.

According to the embodiment, the semiconductor package 1 may further comprise a molding compound 30 encapsulating the chip stack 100 and the top surface 10a of the carrier substrate 10 not occupied by the chip stack 100. The molding compound 30 may be subjected to a curing process. The molding compound 30 may comprise a mixture of epoxy and silica fillers, but not limited thereto.

According to the embodiment, on a top surface 11a of the semiconductor die 11, a plurality of bonding pads 111 and 112 are arranged within its peripheral wire-bonding pad area. For example, in a case that the semiconductor die 11 is a DRAM KGD, the bonding pads 111 may comprise CA (command/address) signal pads, and the bonding pads 112 may comprise DQ (data) pads. According to the embodiment, the bonding pads 111 are disposed along a first edge of the semiconductor die 11, and the bonding pads 112 are disposed along a second edge opposite to the first edge of the semiconductor die 11.

According to the embodiment, on a top surface 20a of the interposer 20, a plurality of bonding pads 201, 202, and 203 are arranged within its peripheral wire-bonding pad area. According to the embodiment, the bonding pads 201 are disposed in proximity to the bonding pads 111 on the top surface 11a of the semiconductor die 11. The bonding pads 202 and 203 are disposed in proximity to the bonding pads 112 on the top surface 11a of the semiconductor die 11.

According to the embodiment, at least one of the bonding pads 201 is electrically coupled to at least one of the bonding pads 111, for example, a CA signal pad, through a bonding wire 311. The bonding pad 201 may be rerouted and rearranged, via an internal trace 204, to electrically couple to the bonding pad 203 that is in proximity to the bonding pad (DQ pad) 202.

The I/O pads 122 for transmitting DQ and CA signals on the active surface of the semiconductor die 12 may be electrically coupled to the bonding pad 202 and 203 through bonding wires 412 and 413, respectively. The I/O pad 121 for transmitting, for example, power or ground, may be electrically coupled to the bonding finger 101 on the first surface 10a of the carrier substrate 10 through the bonding wire 411.

It is advantageous to use the present invention because the interposer 20 may provide a RF shielding (such as a solid ground plane 205) between the semiconductor die 11 and the semiconductor die 12. The RF performance of the semiconductor package 1 is improved. It is more cost effective when compared to the conventional DDR with RDL.

Further, by incorporating the interposer 20 between the semiconductor die 11 and the semiconductor die 12, the CA signals of the first semiconductor die (e.g. DRAM KGD) 11 may be transmitted through the internal trace 204 of the interposer 20 and through the bonding wire 413 extending between the I/O pad 122 and the rearranged bonding pad 203. The DQ signals of the first semiconductor die (e.g. DRAM KGD) 11 may be transmitted through the bonding wire 312, the bonding pad (DQ pad) 202 and the bonding wire 412. The length of the bonding wires is reduced.

Moreover, by incorporating the interposer 20 between the semiconductor die 11 and the semiconductor die 12, the overhang problem incurred due to different dimensions of the chips in the chip stack is alleviated. The overhang problem will be described in more detail hereinafter in FIG. 10.

Figure 2:
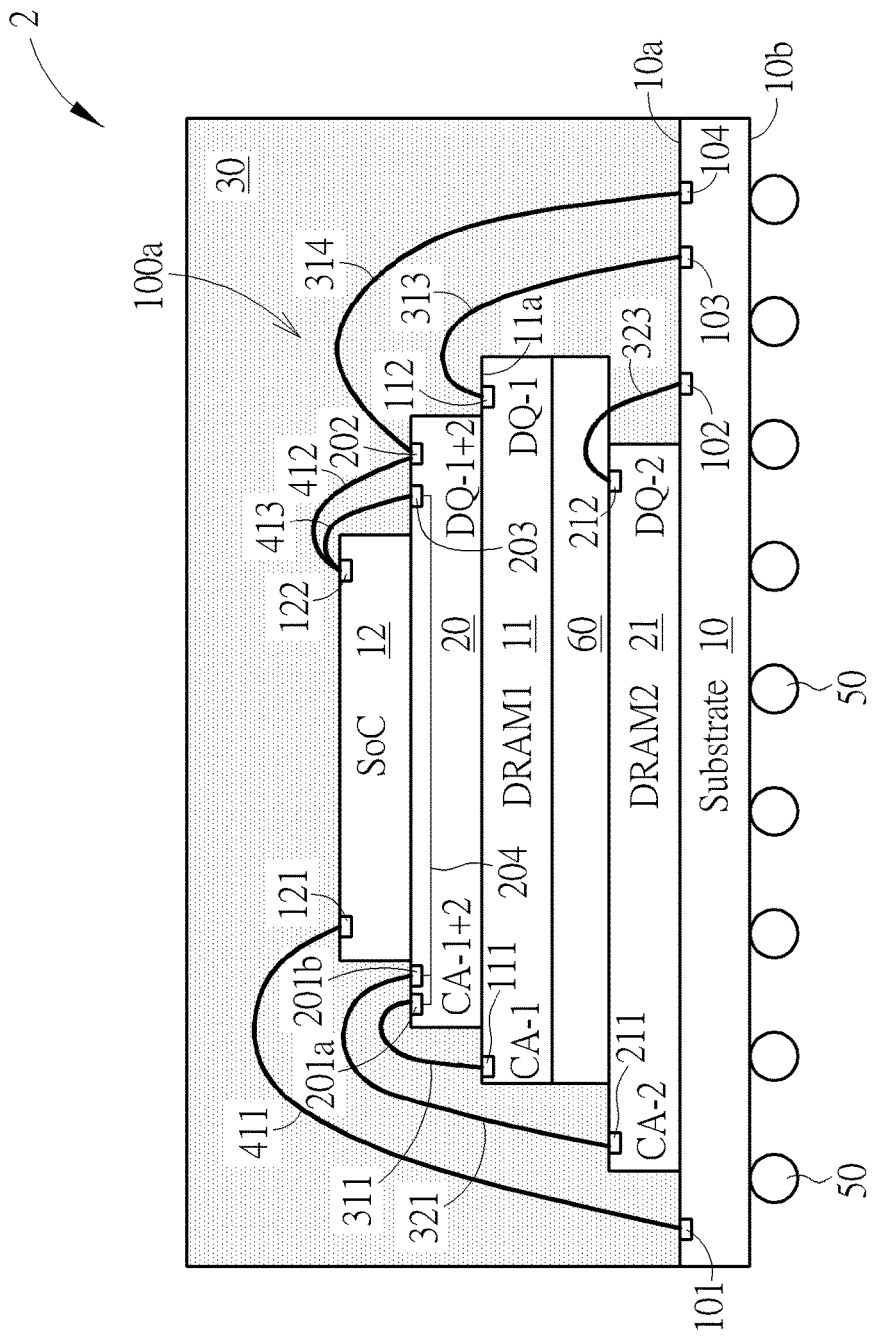
FIG. 2 is a schematic, cross-sectional diagram showing a semiconductor package in accordance with another embodiment of the invention, wherein the exemplary chip stack comprises multiple DRAM KGDs.

Please refer to FIG. 2. FIG. 2 is a schematic, cross-sectional diagram showing a semiconductor package in accordance with another embodiment of the invention, wherein like numeral numbers designate like layers, elements, or regions.

As shown in FIG. 2, the difference between the semiconductor package 1 of FIG. 1 and the semiconductor package 2 of FIG. 2 is that the chip stack 100a of the semiconductor package 2 further comprises a semiconductor die 21 such as a DRAM KGD between the semiconductor die (e.g. DRAM KGD) 11 and the carrier substrate 10.

According to the embodiment, the semiconductor die 11 may be stacked on the semiconductor die 21 in a stepwise configuration, but is not limited thereto. According to the embodiment, the semiconductor die 11 may be stacked on the semiconductor die 21 by using a film over wire (FOW) technique with an insulating film 60 provided between the semiconductor die 11 and the semiconductor die 21. The insulating film 60 avoids the semiconductor die 11 from contacting the bonding wires 323 extending between the semiconductor die 21 and the carrier substrate 10, and avoids damages to the bonding wires 323.

According to the embodiment, on a top surface 21a of the semiconductor die 21, a plurality of bonding pads 211 and 212 are arranged within its peripheral wire-bonding pad area. For example, the bonding pads 211 may comprise CA (command/address) signal pads, and the bonding pads 212 may comprise DQ (data) pads. Likewise, the bonding pads 211 are disposed along a first edge of the semiconductor die 21, and the bonding pads 212 are disposed along a second edge opposite to the first edge of the semiconductor die 21.

According to the embodiment, on a top surface 20a of the interposer 20, a plurality of bonding pads 201a, 201b, 202, and 203 are arranged within its peripheral wire-bonding pad area. According to the embodiment, the bonding pads 201a and 201b are disposed in proximity to the bonding pads 111 on the top surface 11a of the semiconductor die 11 and the bonding pads 211 on the top surface 21a of the semiconductor die 21. The bonding pads 202 and 203 are disposed in proximity to the bonding pads 112 on the top surface 11a of the semiconductor die 11.

According to the embodiment, at least one of the bonding pads 201a is electrically coupled to at least one of the bonding pads 111, for example, a CA signal pad (CA-1), through a bonding wire 311. At least one of the bonding pads 201b is electrically coupled to at least one of the bonding pads 211, for example, a CA signal pad (CA-2), through a bonding wire 321. The bonding pads 201a and 201b may be rerouted and rearranged, via the internal trace 204, to electrically couple to the bonding pad 203 that is in proximity to the bonding pad (DQ-1+2) 202.

The I/O pads 122 for transmitting DQ and CA signals on the active surface of the semiconductor die 12 may be electrically coupled to the bonding pads 202 and 203 through bonding wires 412 and 413, respectively. The I/O pads 121 for transmitting, for example, power or ground, may be electrically coupled to bonding fingers 101 on the first surface 10a of the carrier substrate 10 through bonding wires 411.

It is one feature of the present invention that the CA signal pads (CA-1 and CA-2) of the two DRAM KGDs are rerouted and rearranged by the interposer 20 and are aggregated together on the interposer 20 on a side in proximity to the corresponding I/O pads of the SoC. According to the embodiment, the CA signals originate out of the I/O pads 122 of the second semiconductor die 12 pass into the bonding pads 203, and into the trace 204 of the interposer 20, and then pass out of the bonding pads 201a and 201b of the interposer 20. Thereafter, the CA signals pass into the bonding pads 111 and 211 of the semiconductor die 11 and the semiconductor die 21, respectively.

According to the embodiment, each of the bonding pads 212 (DQ-2) may be electrically coupled to a bonding finger 102 on the first surface 10a of the carrier substrate 10 through a bonding wire 323. The insulating film 60 may cover the bonding pad 212 and may partially cover the bonding wire 323. As can be seen in FIG. 2, the upper portion of the wire loop is embedded in the insulating film 60.

Each of the bonding pads 112 (DQ-1) of the semiconductor die 11 may be electrically coupled to a bonding finger 103 on the first surface 10a of the carrier substrate 10 through a bonding wire 313. Each of the bonding pads 202 (DQ-1+2) on the interposer 20 for transmitting DQ signals may be electrically coupled to a bonding finger 104 on the first surface 10a of the carrier substrate 10 through a bonding wire 314. According to the embodiment, the DQ signals are transmitted between the SoC (the semiconductor die 12) and the DRAM KGDs (the semiconductor die 11 and the semiconductor die 21) through the carrier substrate 10 and the interposer 20.

Figure 3:
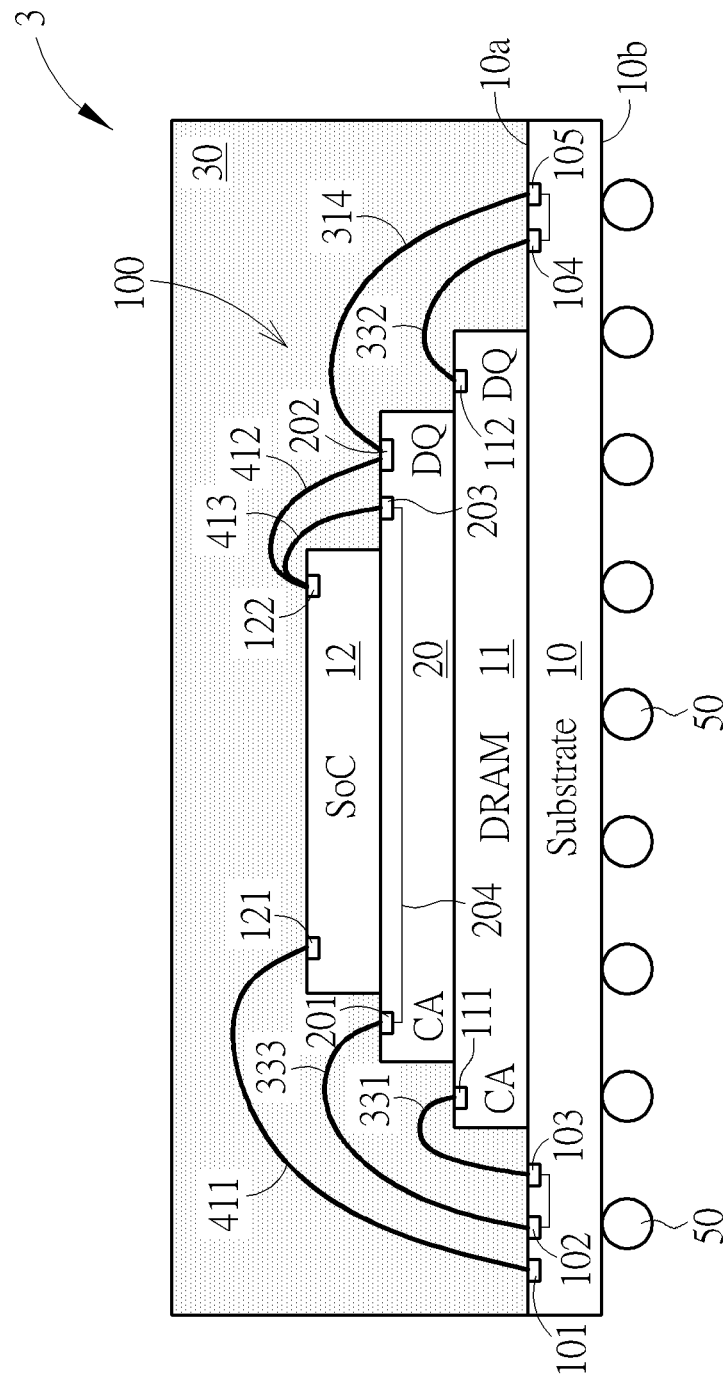
FIG. 3 is a schematic, cross-sectional diagram showing a semiconductor package in accordance with another embodiment of the invention, wherein the exemplary SoC communicates with the exemplary DRAM KGD through the interposer and the substrate.

Please refer to FIG. 3. FIG. 3 is a schematic, cross-sectional diagram showing a semiconductor package in accordance with another embodiment of the invention, wherein like numeral numbers designate like layers, elements, or regions. According to another embodiment, the CA signals may be transmitted between the SoC and the DRAM KGD through the interposer 20 and the carrier substrate 10.

As shown in FIG. 3, likewise, the semiconductor package 3 comprises a carrier substrate 10 having opposite first surface 10a and second surface 10b. A chip stack 100 is disposed on the first surface 10a of the carrier substrate 10. The chip stack 100 comprises a semiconductor die 11 that is directly mounted on the first surface 10a of the carrier substrate 10, an interposer 20 directly mounted on a top surface 11a of the semiconductor die 11, and a semiconductor die 12 directly mounted on a top surface 20a of the interposer 20.

The bonding pad 111, for example, a CA signal pad of the semiconductor die 11, is electrically coupled to a bonding finger 103 through a bonding wire 331 and a bonding pad (CA pad) 201 of the interposer 20 is electrically coupled to a bonding finger 102 through a bonding wire 333. The bonding finger 103 may be electrically coupled to the bonding finger 102 through the internal trace in the carrier substrate 10.

The bonding pad 112, for example, a DQ signal pad of the semiconductor die 11, is electrically coupled to a bonding finger 104 through a bonding wire 332 and a bonding pad (DQ) 202 of the interposer 20 is electrically coupled to a bonding finger 105 through a bonding wire 314. The bonding finger 105 may be electrically coupled to the bonding finger 104 through the internal trace in the carrier substrate 10.

Figure 4:
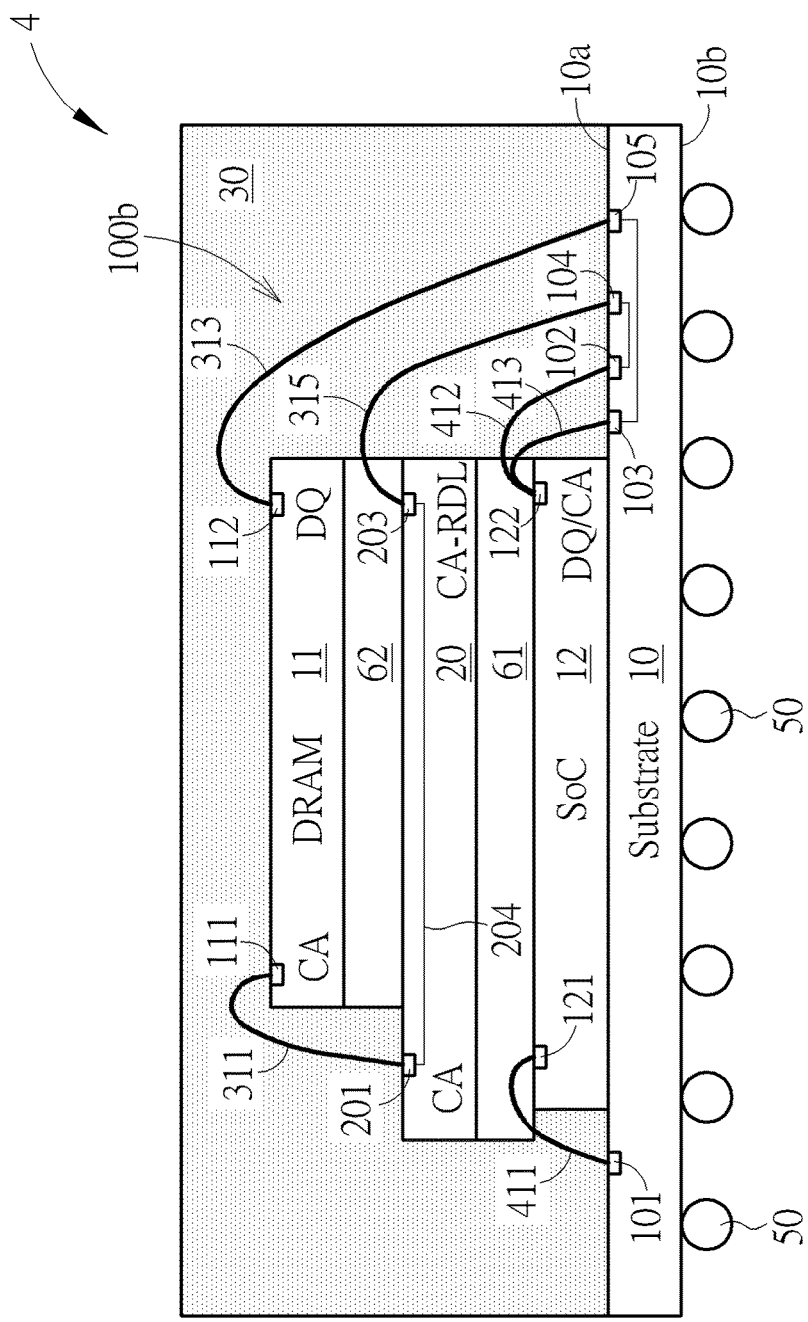
FIG. 4 is a schematic, cross-sectional diagram showing a semiconductor package in accordance with still another embodiment of the invention, wherein the exemplary SoC is disposed between the substrate and the interposer and the exemplary DRAM KGD is disposed on the interposer.

Please refer to FIG. 4. FIG. 4 is a schematic, cross-sectional diagram showing a semiconductor package in accordance with still another embodiment of the invention, wherein like numeral numbers designate like layers, elements, or regions. According to another embodiment, the chip stack has a reversed configuration compared to the embodiment as set forth in FIG. 1.

As shown in FIG. 4, the semiconductor package 4 comprises a carrier substrate 10 having opposite first surface 10a and second surface 10b. A chip stack 100b is disposed on the first surface 10a of the carrier substrate 10. The chip stack 100b comprises a semiconductor die 12 that is directly mounted on the first surface 10a of the carrier substrate 10, an interposer 20 mounted on the semiconductor die 12, and a semiconductor die 11 mounted on the interposer 20.

According to the embodiment, an insulating film 61 may be disposed between the semiconductor die 12 and the interposer 20 and an insulating film 62 may be disposed between the interposer 20 and the semiconductor die 11. The insulating film 61 and the insulating film 62 may be formed by using a FOW technique.

According to the embodiment, the semiconductor die 12 such as a SoC is placed at the bottom of the chip stack 100b, and the semiconductor die 11 such as a DRAM KGD is placed at the top of the chip stack 100b. Both of the semiconductor die 11 and the semiconductor die 12 are wire-bonded chips.

According to the embodiment, the I/O pads 122 for transmitting DQ and CA signals on the active surface of the semiconductor die 12 may be electrically coupled to the bonding fingers 102 and 103 through bonding wires 412 and 413, respectively. The I/O pad 121 for transmitting, for example, power or ground, may be electrically coupled to the bonding finger 101 on the first surface 10a of the carrier substrate 10 through the bonding wire 411.

According to the embodiment, on a top surface 11a of the semiconductor die 11, a plurality of bonding pads 111 and 112 are arranged within its peripheral wire-bonding pad area. For example, in a case that the semiconductor die 11 is a DRAM KGD, the bonding pads 111 may comprise CA (command/address) signal pads, and the bonding pads 112 may comprise DQ (data) pads. According to the embodiment, the bonding pads 111 are disposed along a first edge of the semiconductor die 11, and the bonding pads 112 are disposed along a second edge opposite to the first edge of the semiconductor die 11.

According to the embodiment, on a top surface 20a of the interposer 20, a plurality of bonding pads 201 and 203 are arranged within its peripheral wire-bonding pad area. According to the embodiment, the bonding pads 201 are disposed in proximity to the bonding pads 111 on the top surface 11a of the semiconductor die 11. The bonding pads 203 are disposed in proximity to the bonding pads 112 on the top surface 11a of the semiconductor die 11.

According to the embodiment, at least one of the bonding pads 201 is electrically coupled to at least one of the bonding pads 111, for example, a CA signal pad, through a bonding wire 311. The bonding pad 201 may be rerouted and rearranged, via an internal trace 204, to electrically couple to the bonding pad 203 (CA-RDL).

The bonding pad 203 is electrically coupled to the bonding finger 104 on the first surface 10a of the carrier substrate 10 through the bonding wire 315. Through the internal trace of the carrier substrate 10, the bonding finger 104 may be electrically coupled to the bonding finger 102 to pass CA signal between the semiconductor die 12 and the semiconductor die 11.

According to the embodiment, at least one of the bonding pads 112, for example, a DQ signal pad, is electrically coupled to the bonding finger 105 through a bonding wire 313. Through the internal trace of the carrier substrate 10, the bonding finger 105 may be electrically coupled to the bonding finger 103 to pass DQ signal between the semiconductor die 12 and the semiconductor die 11.

Figure 5:
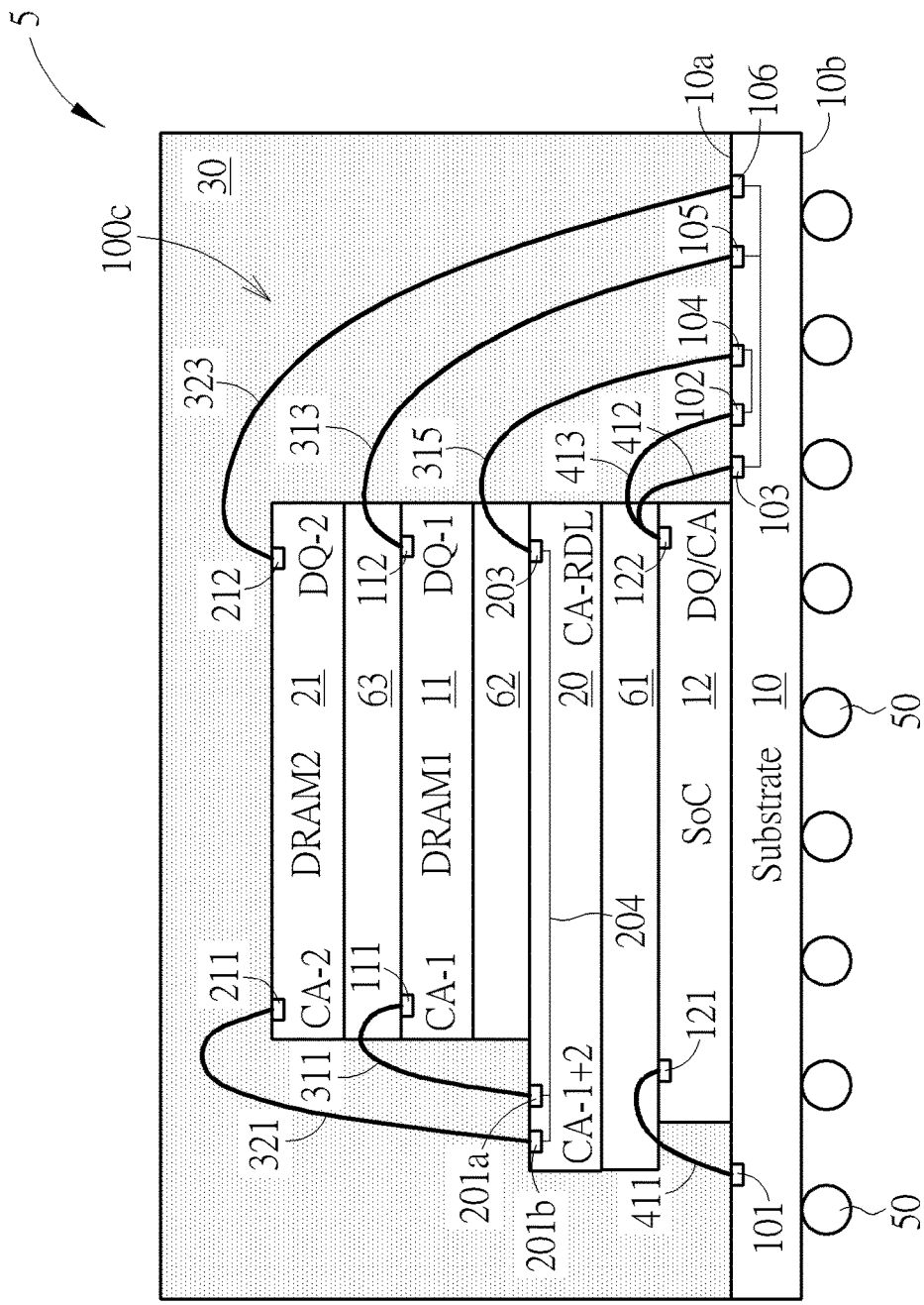
FIG. 5 is a schematic, cross-sectional diagram showing a semiconductor package in accordance with still another embodiment of the invention, wherein the exemplary chip stack comprises multiple DRAM KGDs.

Please refer to FIG. 5. FIG. 5 is a schematic, cross-sectional diagram showing a semiconductor package in accordance with still another embodiment of the invention, wherein like numeral numbers designate like layers, elements, or regions.

As shown in FIG. 5, the difference between the semiconductor package 4 of FIG. 4 and the semiconductor package 5 of FIG. 5 is that the chip stack 100c of the semiconductor package 5 further comprises a semiconductor die 21 such as a DRAM KGD over the semiconductor die 11. According to the embodiment, the semiconductor die 21 may be stacked on the semiconductor die 11 by using a FOW technique with an insulating film 63 provided between the semiconductor die 21 and the semiconductor die 11.

According to the embodiment, on a top surface 21a of the semiconductor die 21, a plurality of bonding pads 211 and 212 are arranged within its peripheral wire-bonding pad area. For example, the bonding pads 211 may comprise CA signal pads (CA-2), and the bonding pads 212 may comprise DQ pads (DQ-2). Likewise, the bonding pads 211 are disposed along a first edge of the semiconductor die 21, and the bonding pads 212 are disposed along a second edge opposite to the first edge of the semiconductor die 21.

According to the embodiment, on a top surface 20a of the interposer 20, a plurality of bonding pads 201a, 201b, and 203 are arranged within its peripheral wire-bonding pad area. According to the embodiment, the bonding pads (CA-1+2) 201a and 201b are disposed in proximity to the bonding pads 111 on the top surface 11a of the semiconductor die 11 and the bonding pads 211 on the top surface 21a of the semiconductor die 21. The bonding pads (CA-RDL) 203 are disposed in proximity to the bonding pads 112 on the top surface 11a of the semiconductor die 11.

According to the embodiment, at least one of the bonding pads 201a is electrically coupled to at least one of the bonding pads 111, for example, a CA signal pad (CA-1), through a bonding wire 311. At least one of the bonding pads 201b is electrically coupled to at least one of the bonding pads 211, for example, a CA signal pad (CA-2), through a bonding wire 321. The bonding pads 201a and 201b may be rerouted and rearranged, via an internal trace 204, to electrically couple to the bonding pad 203. According to the embodiment, the bonding pad 203 is electrically coupled to the bonding finger 104 through a bonding wire 315.

According to the embodiment, each of the bonding pads (DQ-1) 112 of the semiconductor die 11 may be electrically coupled to a bonding finger 105 on the first surface 10a of the carrier substrate 10 through a bonding wire 313. Each of the bonding pads (DQ-2) 212 of the semiconductor die 21 may be electrically coupled to a bonding finger 106 on the first surface 10a of the carrier substrate 10 through a bonding wire 323.

The I/O pads 122 for transmitting DQ and CA signals on the active surface of the semiconductor die 12 may be electrically coupled to the bonding fingers 103 and 102 through bonding wires 412 and 413, respectively. The I/O pads 121 for transmitting, for example, power or ground, may be electrically coupled to bonding fingers 101 on the first surface 10a of the carrier substrate 10 through bonding wires 411.

Figure 6:
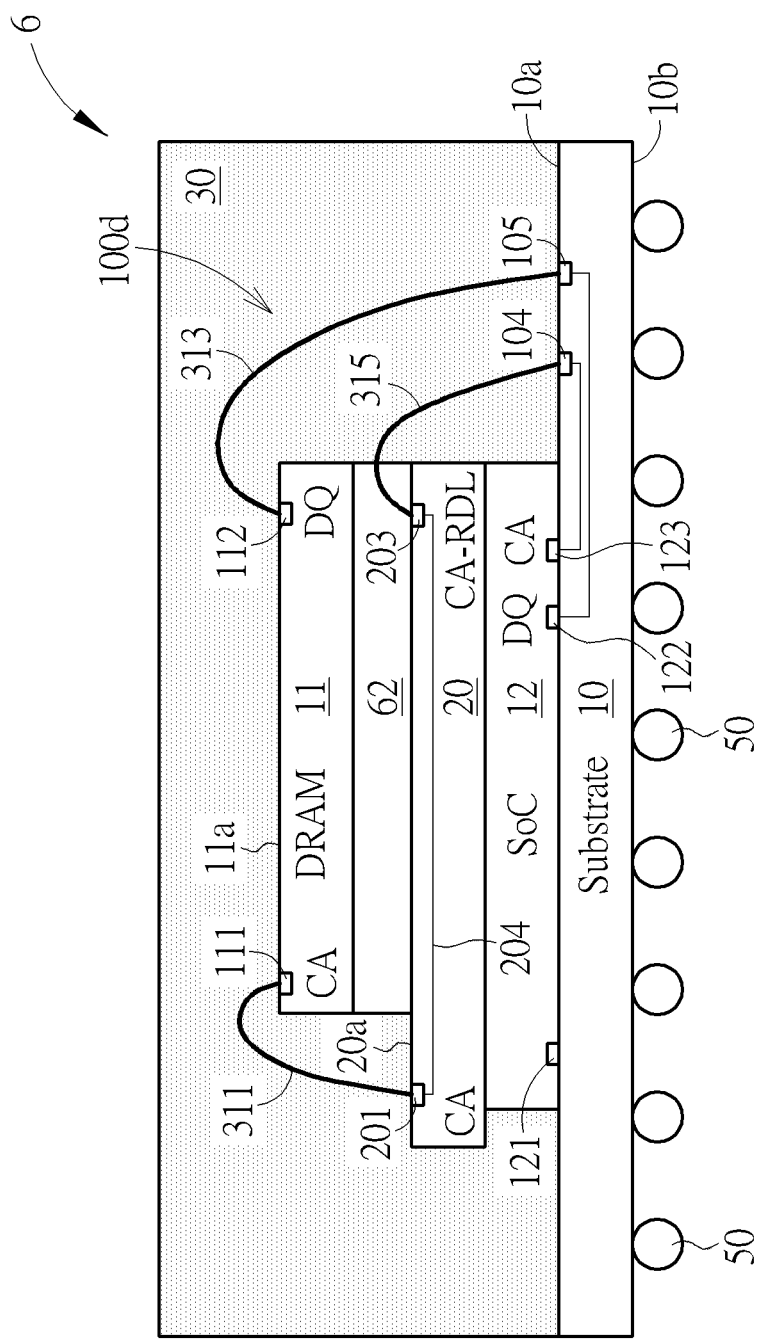
FIG. 6 is a schematic, cross-sectional diagram showing a semiconductor package in accordance with still another embodiment of the invention, wherein the exemplary SoC is a flip chip and the exemplary DRAM KGD is a wire-bonded chip.

Please refer to FIG. 6. FIG. 6 is a schematic, cross-sectional diagram showing a semiconductor package in accordance with still another embodiment of the invention, wherein like numeral numbers designate like layers, elements, or regions. According to another embodiment, the chip stack has a reversed configuration compared to the embodiment as set forth in FIG. 1.

The semiconductor package 6 of FIG. 6 is similar with the semiconductor package 4 of FIG. 4. The difference between the semiconductor package 6 of FIG. 6 and the semiconductor package 4 of FIG. 4 is that the semiconductor die 12 of the semiconductor package 6 of FIG. 6 is a flip chip.

As shown in FIG. 6, the semiconductor package 6 comprises a carrier substrate 10 having opposite first surface 10a and second surface 10b. A chip stack 100d is disposed on the first surface 10a of the carrier substrate 10. The chip stack 100d comprises a flip-chip semiconductor die 12 that is directly mounted on the first surface 10a of the carrier substrate 10, an interposer 20 mounted on the semiconductor die 12, and a semiconductor die 11 mounted on the interposer 20. An insulating film 62 may be disposed between the interposer 20 and the semiconductor die 11. The insulating film 62 may be formed by using a FOW technique.

According to the embodiment, the semiconductor die 12 such as a SoC is placed at the bottom of the chip stack 100d and the semiconductor die 11 such as a DRAM KGD is placed at the top of the chip stack 100d. The semiconductor die 12 may have bumped active surface that directly faces and connects the first surface 10a of the carrier substrate 10 by using flip chip techniques known in the art.

According to the embodiment, the interposer 20 may be disposed directly on the inactive surface of the semiconductor die 12. Therefore, the insulating film 61 between the interposer 20a and the semiconductor die 12 as shown in FIG. 4 can be spared.

According to the embodiment, the I/O pads 122 and 123 for transmitting DQ and CA signals, respectively, on the active surface of the semiconductor die 12 may be electrically coupled to the internal traces of the carrier substrate 10 without using a bonding wire. Therefore, the length of the signal path can be shortened.

According to the embodiment, likewise, on a top surface 11a of the semiconductor die 11, a plurality of bonding pads 111 and 112 are arranged within its peripheral wire-bonding pad area. For example, in a case that the semiconductor die 11 is a DRAM KGD, the bonding pads 111 may comprise CA signal pads, and the bonding pads 112 may comprise DQ pads. According to the embodiment, the bonding pads 111 are disposed along a first edge of the semiconductor die 11, and the bonding pads 112 are disposed along a second edge opposite to the first edge of the semiconductor die 11.

According to the embodiment, on a top surface 20a of the interposer 20, a plurality of bonding pads 201 and 203 are arranged within its peripheral wire-bonding pad area. According to the embodiment, the bonding pads 201 are disposed in proximity to the bonding pads 111 on the top surface 11a of the semiconductor die 11. The bonding pads 203 are disposed in proximity to the bonding pads 112 on the top surface 11a of the semiconductor die 11.

According to the embodiment, at least one of the bonding pads 201 is electrically coupled to at least one of the bonding pads 111, for example, a CA signal pad, through a bonding wire 311. The bonding pad 201 may be rerouted and rearranged, via an internal trace 204, to electrically couple to the bonding pad 203 (CA-RDL) on an opposite edge of the interposer 20.

The bonding pad 203 is electrically coupled to the bonding finger 104 on the first surface 10a of the carrier substrate 10 through the bonding wire 315. Through the internal trace of the carrier substrate 10, the bonding finger 104 may be electrically coupled to the I/O pad 123 to pass CA signal between the semiconductor die 12 and the semiconductor die 11.

According to the embodiment, at least one of the bonding pads 112, for example, a DQ signal pad, is electrically coupled to the bonding finger 105 through a bonding wire 313. Through the internal trace of the carrier substrate 10, the bonding finger 105 may be electrically coupled to the I/O pad 122 to pass DQ signal between the semiconductor die 12 and the semiconductor die 11.

Figure 7:
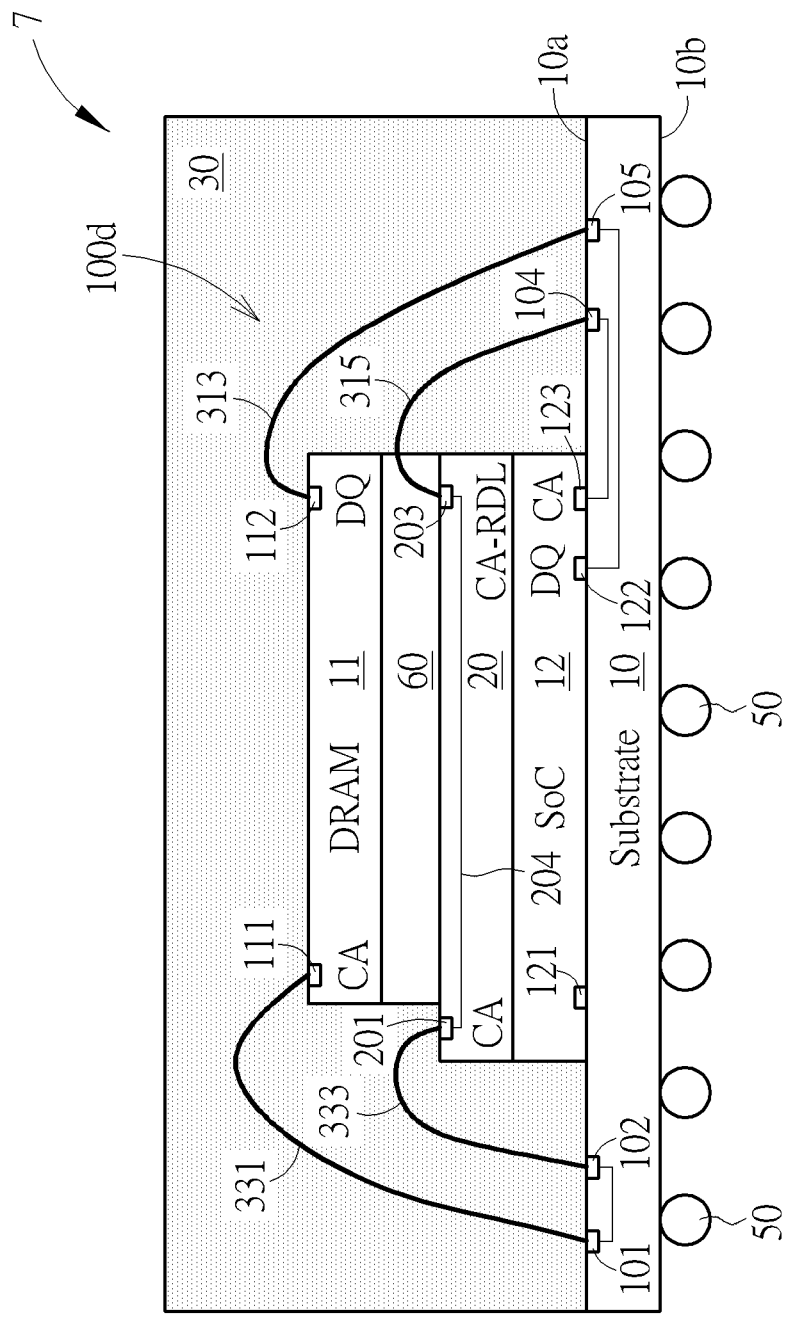
FIG. 7 is a schematic, cross-sectional diagram showing a semiconductor package in accordance with still another embodiment of the invention, wherein the exemplary SoC communicates with the exemplary DRAM KGD through the interposer and the substrate.

Please refer to FIG. 7. FIG. 7 is a schematic, cross-sectional diagram showing a semiconductor package in accordance with still another embodiment of the invention, wherein like numeral numbers designate like layers, elements, or regions. According to another embodiment, the CA signals may be transmitted between the SoC and the DRAM KGD through the interposer 20 and the carrier substrate 10.

Figure 11:
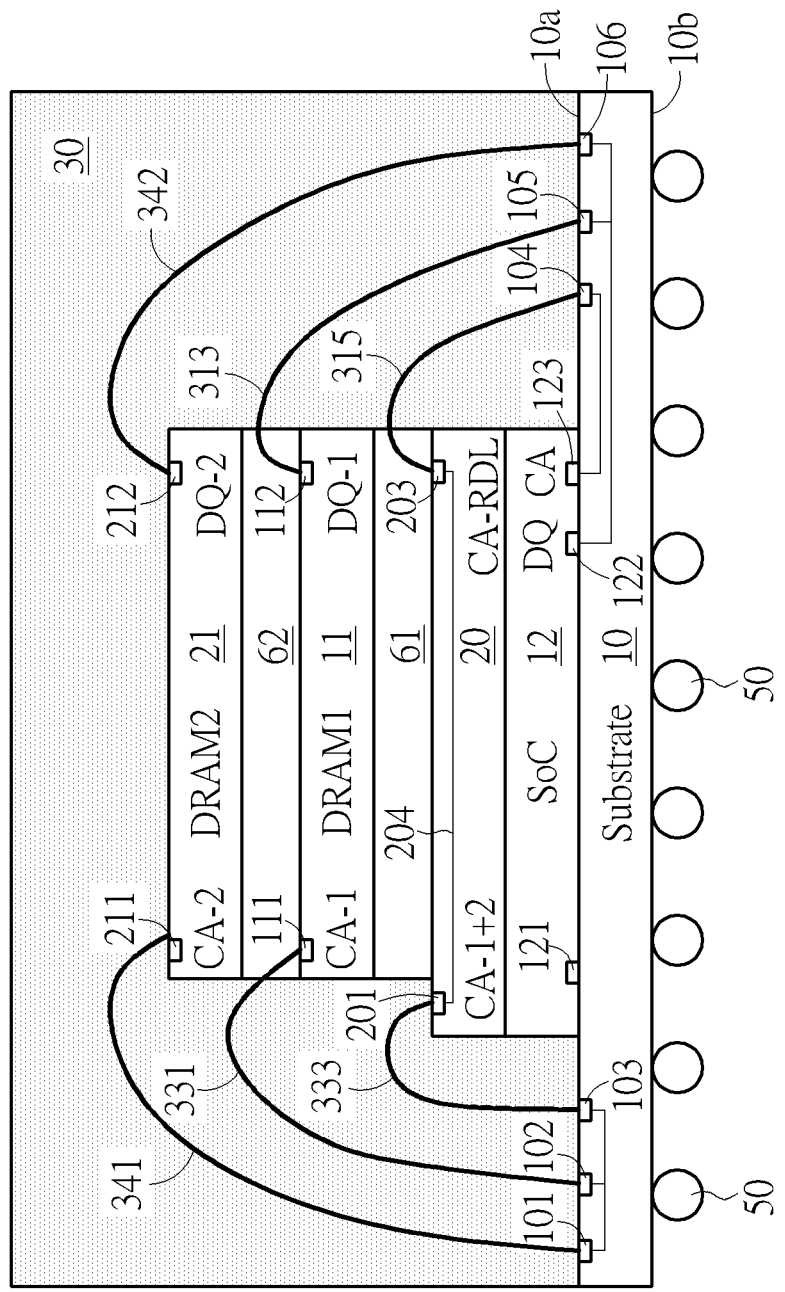
FIG. 11 is a variant of the semiconductor package depicted in FIG. 7, wherein two DRAM chips are stacked on the interposer.

As shown in FIG. 7, likewise, the semiconductor package 7 comprises the same chip stack 100d as set forth in FIG. 6. The chip stack 100d comprises a flip-chip semiconductor die 12 that is directly mounted on the first surface 10a of the carrier substrate 10, an interposer 20 directly mounted on the semiconductor die 12, and a semiconductor die 11 disposed on the interposer 20. Although only one DRAM KGD (semiconductor die 11) is shown in this figure, it is understood that multiple DRAM KGDs may be disposed on the interposer 20, as shown in FIG. 11. In FIG. 11, two DRAM KGDs: semiconductor die 11 and semiconductor die 21, are stacked on the interposer 20.

The bonding pad 111, for example, a CA signal pad of the semiconductor die 11, is electrically coupled to a bonding finger 101 through a bonding wire 331 and a bonding pad 201 of the interposer 20 is electrically coupled to a bonding finger 102 through a bonding wire 333. The bonding finger 101 may be electrically coupled to the bonding finger 102 through the internal trace in the carrier substrate 10.

The bonding pad 112, for example, a DQ signal pad of the semiconductor die 11, is electrically coupled to a bonding finger 105 through a bonding wire 313 and a bonding pad (CA-RDL) 203 of the interposer 20 is electrically coupled to a bonding finger 104 through a bonding wire 315. Through the internal trace of the carrier substrate 10, the bonding fingers 105 and 104 may be electrically coupled to the I/O pads 122 and 123 to pass DQ signal and CA signal, respectively, between the semiconductor die 12 and the semiconductor die 11.

Figure 8:
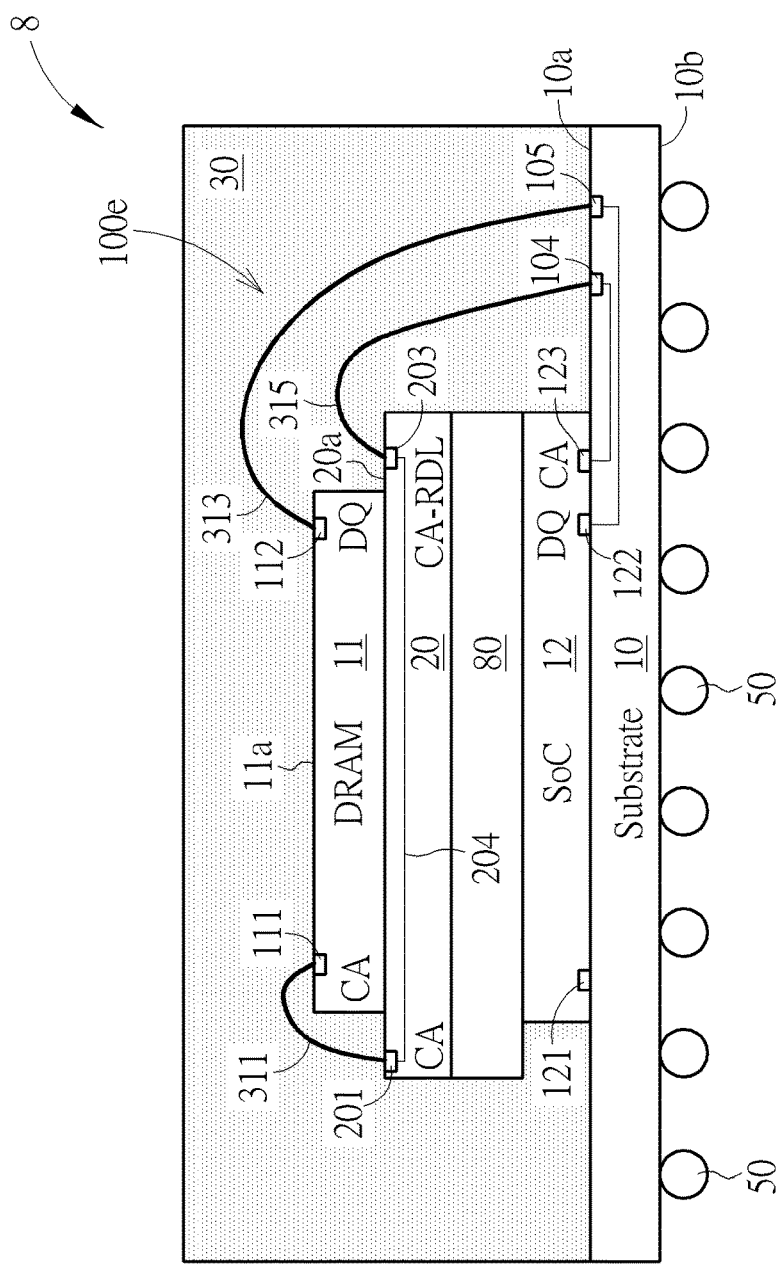
FIG. 8 is a schematic, cross-sectional diagram showing a semiconductor package in accordance with still another embodiment of the invention, wherein a dummy silicon die is situated directly under the interposer.

Please refer to FIG. 8. FIG. 8 is a schematic, cross-sectional diagram showing a semiconductor package in accordance with still another embodiment of the invention, wherein like numeral numbers designate like layers, elements, or regions.

The semiconductor package 8 of FIG. 8 is similar with the semiconductor package 6 of FIG. 6. The difference between the semiconductor package 8 of FIG. 8 and the semiconductor package 6 of FIG. 6 is that the semiconductor package 8 comprises a rigid supporting substrate such as a dummy silicon die directly under the interposer 20.

As shown in FIG. 8, the semiconductor package 8 comprises a carrier substrate 10 having opposite first surface 10a and second surface 10b. A chip stack 100e is disposed on the first surface 10a of the carrier substrate 10. The chip stack 100e comprises a flip-chip semiconductor die 12 that is directly mounted on the first surface 10a of the carrier substrate 10, an interposer 20 mounted on the semiconductor die 12, a rigid supporting substrate 80 such as a dummy silicon die between the interposer 20 and the semiconductor die 12, and a semiconductor die 11 mounted on the interposer 20. According to the embodiment, no insulating film is disposed between the interposer 20 and the semiconductor die 11. The term "dummy" used herein means that the rigid supporting substrate 80 does not provide any direct electrical connection between the interposer 20 and the semiconductor die 12.

The rigid supporting substrate 80 that is attached to a bottom surface of the interposer 20 may function as a stiffener and may provide the interposer 20 with mechanical support, which facilitates the wire-bonding process and improves the production yield. The rigid supporting substrate 80 may also improve the warpage of the package.

According to the embodiment, the semiconductor die 12 such as a SoC is placed at the bottom of the chip stack 100d and the semiconductor die 11 such as a DRAM KGD is placed at the top of the chip stack 100d. The semiconductor die 12 may have bumped active surface that directly faces and connects the first surface 10a of the carrier substrate 10 by using flip chip techniques known in the art. According to the embodiment, the rigid supporting substrate 80 is disposed directly on the inactive surface of the semiconductor die 12.

According to the embodiment, the I/O pads 122 and 123 for transmitting DQ and CA signals, respectively, on the active surface of the semiconductor die 12 may be electrically coupled to the internal traces without using a bonding wire. On a top surface 11a of the semiconductor die 11, a plurality of bonding pads 111 and 112 are arranged within its peripheral wire-bonding pad area. For example, in a case that the semiconductor die 11 is a DRAM KGD, the bonding pads 111 may comprise CA signal pads, and the bonding pads 112 may comprise DQ pads. According to the embodiment, the bonding pads 111 are disposed along a first edge of the semiconductor die 11, and the bonding pads 112 are disposed along a second edge opposite to the first edge of the semiconductor die 11.

According to the embodiment, on a top surface 20a of the interposer 20, a plurality of bonding pads 201 and 203 are arranged within its peripheral wire-bonding pad area. According to the embodiment, the bonding pads 201 are disposed in proximity to the bonding pads 111 on the top surface 11a of the semiconductor die 11. The bonding pads 203 are disposed in proximity to the bonding pads 112 on the top surface 11a of the semiconductor die 11.

According to the embodiment, at least one of the bonding pads 201 is electrically coupled to at least one of the bonding pads 111, for example, a CA signal pad, through a bonding wire 311. The bonding pad 201 may be rerouted and rearranged, via an internal trace 204, to electrically couple to the bonding pad 203 (CA-RDL) on an opposite edge of the interposer 20.

The bonding pad 203 is electrically coupled to the bonding finger 104 on the first surface 10a of the carrier substrate 10 through the bonding wire 315. Through the internal trace of the carrier substrate 10, the bonding finger 104 may be electrically coupled to the I/O pad 123 to pass CA signal between the semiconductor die 12 and the semiconductor die 11.

According to the embodiment, at least one of the bonding pads 112, for example, a DQ signal pad, is electrically coupled to the bonding finger 105 through a bonding wire 313. Through the internal trace of the carrier substrate 10, the bonding finger 105 may be electrically coupled to the I/O pad 122 to pass DQ signal between the semiconductor die 12 and the semiconductor die 11.

Figure 9:
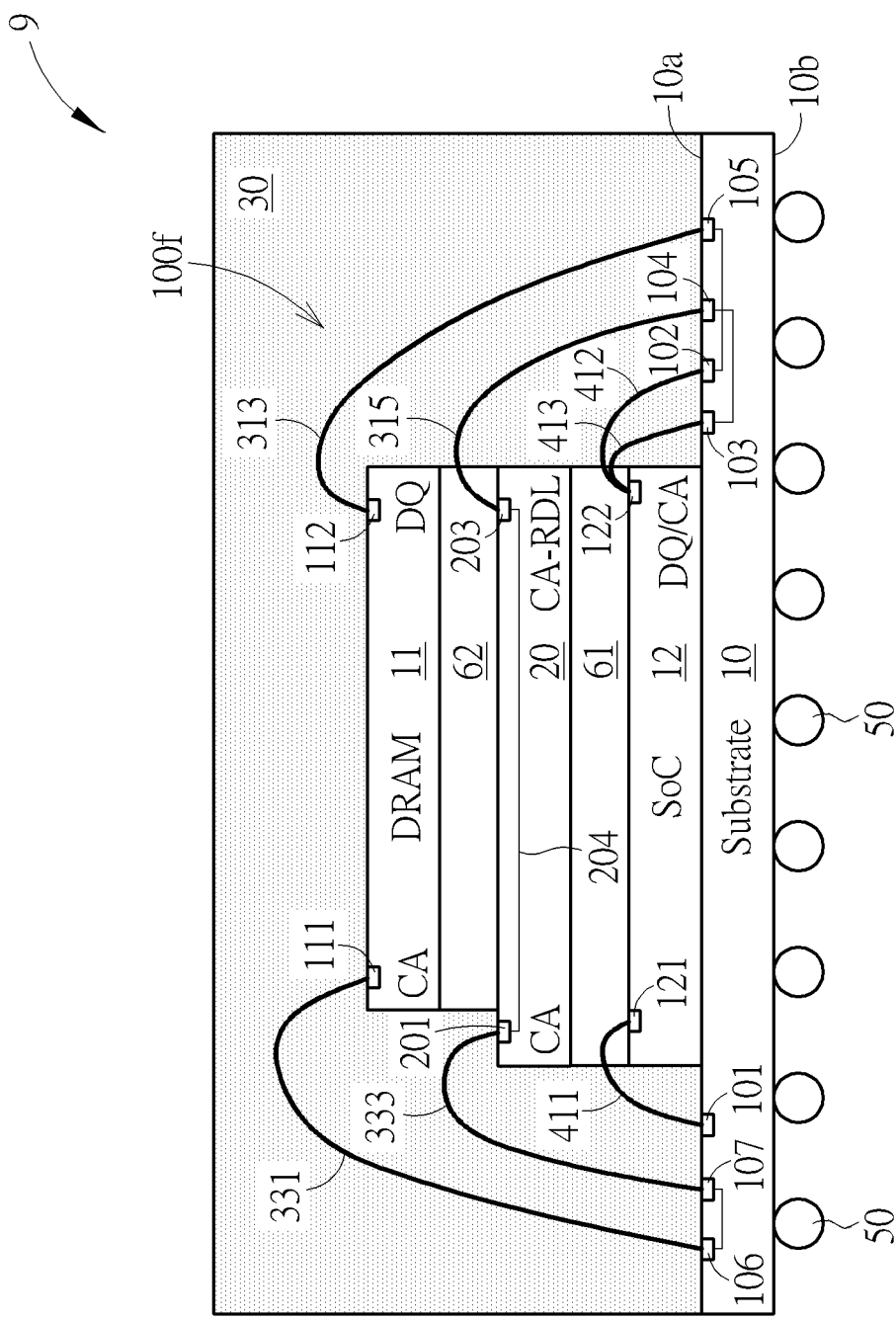
FIG. 9 is a schematic, cross-sectional diagram showing a semiconductor package in accordance with still another embodiment of the invention, wherein the exemplary SoC is a wire-bonded chip.

Please refer to FIG. 9. FIG. 9 is a schematic, cross-sectional diagram showing a semiconductor package in accordance with still another embodiment of the invention, wherein like numeral numbers designate like layers, elements, or regions.

The semiconductor package 9 of FIG. 9 is similar with the semiconductor package 7 of FIG. 7. The difference between the semiconductor package 9 of FIG. 9 and the semiconductor package 7 of FIG. 7 is that the exemplary SoC of the semiconductor package 9 is a wire-bonded chip.

As shown in FIG. 9, likewise, the semiconductor package 9 comprises a carrier substrate 10 and a chip stack 100f on the carrier substrate 10. The chip stack 100f comprises a semiconductor die 12 that is directly mounted on the first surface 10a of the carrier substrate 10, an interposer 20 disposed on the semiconductor die 12, and a semiconductor die 11 disposed on the interposer 20.

According to the embodiment, an insulating film 61 may be disposed between the semiconductor die 12 and the interposer 20 and an insulating film 62 may be disposed between the interposer 20 and the semiconductor die 11. The insulating film 61 and the insulating film 62 may be formed by using a FOW technique.

The bonding pad 111, for example, a CA signal pad of the semiconductor die 11, is electrically coupled to a bonding finger 106 through a bonding wire 331 and a bonding pad 201 of the interposer 20 is electrically coupled to a bonding finger 107 through a bonding wire 333. The bonding finger 106 is electrically coupled to the bonding finger 107 through the internal trace in the carrier substrate 10.

The bonding pad 112, for example, a DQ signal pad of the semiconductor die 11, is electrically coupled to a bonding finger 105 through a bonding wire 313 and a bonding pad 203 of the interposer 20 is electrically coupled to a bonding finger 104 through a bonding wire 315.

According to the embodiment, the I/O pads 122 for transmitting DQ and CA signals on the active surface of the semiconductor die 12 may be electrically coupled to the bonding fingers 102 and 103 through bonding wires 412 and 413, respectively. The I/O pad 121 for transmitting, for example, power or ground, may be electrically coupled to the bonding finger 101 on the first surface 10a of the carrier substrate 10 through the bonding wire 411.

Figure 10:
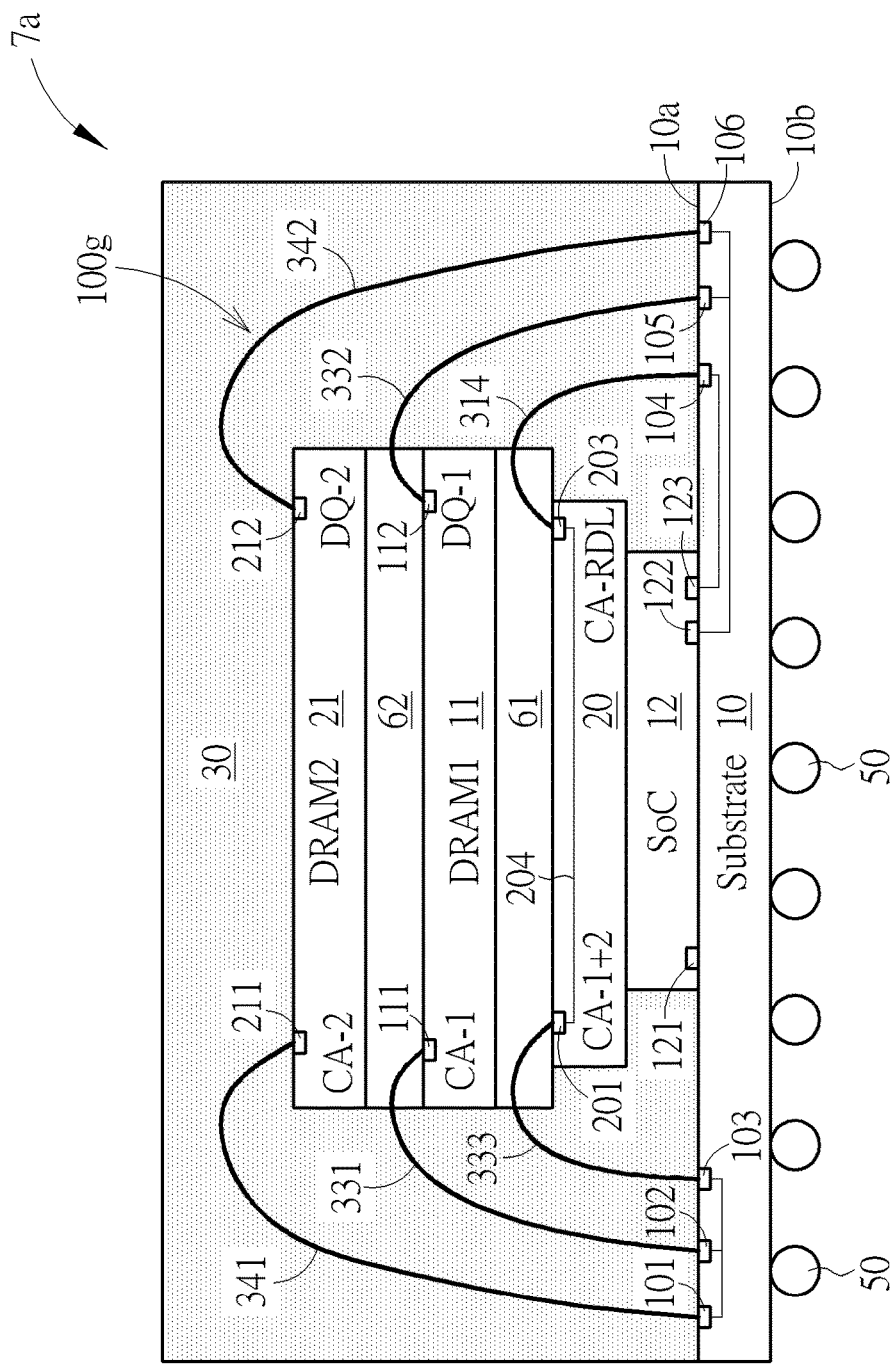
FIG. 10 is a schematic, cross-sectional diagram showing a semiconductor package in accordance with still another embodiment of the invention, wherein the interposer improves the overhang problem between the exemplary SoC and the exemplary DRAM KGD.

Please refer to FIG. 10. FIG. 10 is a schematic, cross-sectional diagram showing a semiconductor package in accordance with still another embodiment of the invention, wherein like numeral numbers designate like layers, elements, or regions.

The semiconductor package 7a of FIG. 10 is similar with the semiconductor package 7 of FIG. 7. The differences between the semiconductor package 7a of FIG. 10 and the semiconductor package 7 of FIG. 7 include: (1) the semiconductor package 7a of FIG. 10 has multiple DRAM KGDs on the interposer 20, and (2) the exemplary SoC of the semiconductor package 7a has a smaller dimension than that of the overlying DRAM KGDs in FIG. 10. The interposer 20 can improve the overhang problem between the exemplary DRAM KGD and the exemplary SoC.

As shown in FIG. 10, the semiconductor package 7a comprises a chip stack 100g. The chip stack 100g comprises a flip-chip semiconductor die 12 that is directly mounted on the first surface 10a of the carrier substrate 10, an interposer 20 directly mounted on the semiconductor die 12, a semiconductor die 11 disposed on the interposer 20, and a semiconductor die 21 disposed on the semiconductor die 11. The semiconductor die 11 and the semiconductor die 21 are DRAM KGDs.

According to the embodiment, an insulating film 61 may be disposed between the semiconductor die 11 and the interposer 20 and an insulating film 62 may be disposed between the semiconductor die 21 and the semiconductor die 11. The insulating film 61 and the insulating film 62 may be formed by using a FOW technique.

According to the embodiment, the dimension of the semiconductor die 11 and the dimension of the semiconductor die 21 are greater than the dimension of the semiconductor die 12. Therefore, an overhang is formed between the semiconductor die 11 and the semiconductor die 12. The incorporation of the interposer 20 between semiconductor die 11 and the semiconductor die 12 alleviates such overhang problem and reduces the difficulty of wire bonding.

The bonding pad 111, for example, a CA signal pad of the semiconductor die 11, is electrically coupled to a bonding finger 102 through a bonding wire 331 (CA-1). The bonding pad 211, for example, a CA signal pad of the semiconductor die 21, is electrically coupled to a bonding finger 101 through a bonding wire 341 (CA-2). The bonding pad 201 of the interposer 20 is electrically coupled to a bonding finger 103 through a bonding wire 333. The bonding fingers 102 and 103 may be electrically coupled to the bonding finger 101 through the internal trace in the carrier substrate 10.

The bonding pad 112, for example, a DQ signal pad of the semiconductor die 11, is electrically coupled to a bonding finger 105 through a bonding wire 332 (DQ-1). The bonding pad 212, for example, a DQ signal pad of the semiconductor die 21, is electrically coupled to a bonding finger 106 through a bonding wire 342 (DQ-1). The bonding pad (CA-RDL) 203 of the interposer 20 is electrically coupled to a bonding finger 104 through a bonding wire 314. The bonding finger 104~106 may be electrically coupled to the I/O pads 122 and 123 of the semiconductor die 12 through the internal trace in the carrier substrate 10.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a carrier substrate having opposite first surface and second surface; and
   a chip stack disposed on the first surface of the carrier substrate, wherein the chip stack comprises a first semiconductor die, a second semiconductor die, and an interposer between the first semiconductor die and the second semiconductor die, wherein the interposer transmits signals between the first semiconductor die and the second semiconductor die, wherein the interposer comprises a command/address (CA) bonding pad, a rearranged bonding pad, a data (DQ) bonding pad, and an internal trace electrically coupling the CA bonding pad to the rearranged bonding pad.

2. The semiconductor package according to claim 1, wherein the first semiconductor die and the second semiconductor die are both wire-bonded chips.

3. The semiconductor package according to claim 1, wherein the first semiconductor die comprises a DRAM known-good-die or an application-specific integrated circuit.

4. The semiconductor package according to claim 1, wherein the second semiconductor die comprises a system on chip or an application-specific integrated circuit.

5. The semiconductor package according to claim 1, wherein the carrier substrate comprises an organic package substrate having metal traces and resins.

6. The semiconductor package according to claim 1, wherein the interposer comprises a silicon interposer or a resin substrate interposer.

7. The semiconductor package according to claim 1, wherein the first semiconductor die comprises at least a command/address (CA) signal pad disposed on a first edge of the first semiconductor die, and at least a data (DQ) signal pad disposed on a second edge opposite to the first edge of the first semiconductor die, and wherein the CA bonding pad is in proximity to the CA signal pad and the first edge, and wherein the rearranged bonding pad and the DQ bonding pad are in proximity to the DQ signal pad and the second edge.

8. The semiconductor package according to claim 7, wherein the CA signal pad is electrically coupled to the CA bonding pad of the interposer through a first bonding wire.

9. The semiconductor package according to claim 8, wherein the DQ signal pad is electrically coupled to the DQ bonding pad of the interposer through a second bonding wire.

10. The semiconductor package according to claim 8, wherein the DQ signal pad and the rearranged bonding pad are electrically coupled to the carrier substrate.

11. The semiconductor package according to claim 8, wherein the second semiconductor die comprises an input/output (I/O) pad for transmitting CA signal and an I/O pad for transmitting DQ signal on the active surface of the second semiconductor die.

12. The semiconductor package according to claim 11, wherein the I/O pads for transmitting DQ and CA signals are electrically coupled to the CA bonding pad and the DQ bonding pad through a third bonding wire and a fourth bonding wire, respectively.

13. The semiconductor package according to claim 11, wherein the I/O pads for transmitting DQ and CA signals are electrically coupled to the carrier substrate.

14. The semiconductor package according to claim 1, wherein the interposer further comprises a ground plane shielding the second semiconductor die from the first semiconductor die.

15. The semiconductor package according to claim 1, wherein the second semiconductor die is directly mounted on the first surface of the carrier substrate, the interposer is mounted on the second semiconductor die, and the first semiconductor die is mounted on the interposer.

16. The semiconductor package according to claim 15, wherein the first semiconductor die is a DRAM known-good-die and the second semiconductor die is a system on chip.

17. The semiconductor package according to claim 15 further comprising a first insulating film between the interposer and the second semiconductor die and a second insulating film between the interposer and the first semiconductor die.

18. The semiconductor package according to claim 17, wherein the chip stack further comprising a third semiconductor die adjacent to the first semiconductor die.

19. The semiconductor package according to claim 18 further comprising a third insulating film between the third semiconductor die and the first semiconductor die.

* * * * *